(12) United States Patent
Auch et al.

(10) Patent No.: US 7,221,093 B2
(45) Date of Patent: May 22, 2007

(54) PATTERNING OF ELECTRODES IN OLED DEVICES

(75) Inventors: Mark Auch, Singapore (SG); Ewald Guenther, Singapore (SG); Soo Jin Chua, Singapore (SG)

(73) Assignees: Institute of Materials Research and Engineering, Singapore (SG); Osram Opto Semiconductor GmbH (DE)

( * ) Notice: Subject to any disclaimer, the term of this patent is extended or adjusted under 35 U.S.C. 154(b) by 29 days.

(21) Appl. No.: 10/166,829

(22) Filed: Jun. 10, 2002

(65) Prior Publication Data

US 2003/0227255 A1 Dec. 11, 2003

(51) Int. Cl.
*H01J 1/62* (2006.01)
*H01J 63/04* (2006.01)

(52) U.S. Cl. .............. 313/507; 313/504; 313/506; 313/509; 313/512

(58) Field of Classification Search ......... 313/498–512
See application file for complete search history.

(56) References Cited

U.S. PATENT DOCUMENTS

| | | | | |
|---|---|---|---|---|
| 5,453,659 A * | 9/1995 | Wallace et al. | ............. | 313/495 |
| 5,530,269 A * | 6/1996 | Tang | ............. | 257/88 |
| 5,701,055 A * | 12/1997 | Nagayama et al. | ......... | 313/504 |
| 5,952,037 A | 9/1999 | Nagayama et al. | ........... | 427/66 |
| 5,962,970 A | 10/1999 | Yokoi et al. | ................ | 313/506 |
| 6,107,736 A * | 8/2000 | Shi et al. | .................... | 313/509 |
| 6,111,356 A | 8/2000 | Roitman et al. | ........... | 313/506 |
| 6,198,220 B1 | 3/2001 | Jones et al. | ................. | 313/512 |
| 6,249,084 B1 * | 6/2001 | Yamana | ..................... | 313/504 |
| 6,306,559 B1 * | 10/2001 | Tanamura et al. | ......... | 430/315 |
| 6,339,288 B1 * | 1/2002 | Qian et al. | ................... | 313/498 |
| 6,407,408 B1 * | 6/2002 | Zhou et al. | ................... | 257/40 |
| 6,515,314 B1 * | 2/2003 | Duggal et al. | ............. | 257/184 |
| 6,580,212 B2 * | 6/2003 | Friend | ....................... | 313/504 |
| 6,624,567 B2 * | 9/2003 | Nagayama et al. | ......... | 313/503 |
| 6,692,845 B2 * | 2/2004 | Maruyama et al. | ......... | 428/690 |
| 2001/0017516 A1 | 8/2001 | Gonther | ..................... | 313/504 |
| 2002/0060518 A1 * | 5/2002 | Duineveld et al. | .......... | 313/506 |
| 2003/0062518 A1 | 4/2003 | Auch et al. | | |
| 2003/0094691 A1 | 5/2003 | Auch et al. | | |
| 2004/0207316 A1 * | 10/2004 | Birnstock et al. | ........... | 313/504 |

FOREIGN PATENT DOCUMENTS

EP WO 02/21883 3/2002
WO WO 02/21557 3/2002

* cited by examiner

*Primary Examiner*—Nimeshkumar D. Patel
*Assistant Examiner*—Peter Macchiarolo
(74) *Attorney, Agent, or Firm*—Fish & Richardson P.C.

(57) ABSTRACT

An OLED device having pillars, wherein the pillars serve to pattern a conductive layer during deposition. The profile of the pillars covers the edges of at least one functional layer to protect it from exposure to potentially deleterious substances.

32 Claims, 6 Drawing Sheets

PATTERNING OF ELECTRODES IN OLED DEVICES

FIELD OF THE INVENTION

The present invention relates to an improved patterning of electrodes, such as those in organic light emitting diode (OLED) devices.

BACKGROUND OF THE INVENTION

Figure 1:
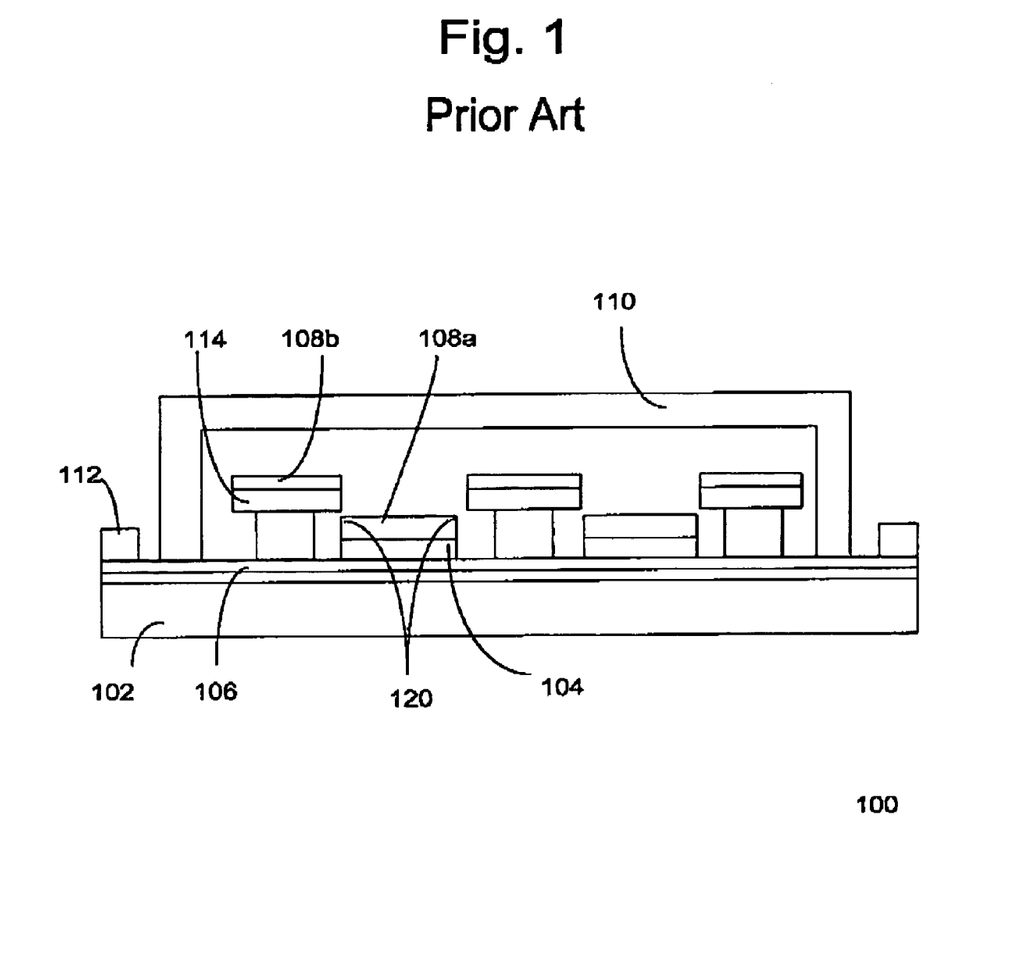
FIG. 1 shows a conventional OLED device employing t-shaped pillars.

FIG. 1 shows a pixelated OLED device 100 which serves, for example, as a display in various types of consumer electronic products, including cellular phones, cellular smart phones, personal organizers, pagers, advertising panels, touch screen displays, teleconferencing and multimedia products, virtual reality products, and display kiosks.

The OLED device comprises a functional stack formed on a substrate 102. The functional stack comprises of one or more organic functional layers 104 between two conductive functional layers (106 and 108) which serve as electrodes (anode and cathode). The conductive layers are patterned as desired. For example, the conductive layers can be patterned to form rows of anodes in a first direction and columns of cathodes in a second direction. OLED cells or pixels are located where the cathodes and anodes overlap. Charge carriers are injected through the cathodes and anodes via bond pads 112 for recombination in the organic layers. The recombination of the charge carriers causes the organic layer of the pixels to emit visible radiation. The device is encapsulated with a cap 110, hermetically sealing the cells.

As shown in FIG. 1, t-shaped pillars 114 are used to facilitate patterning of the upper conductive layer. The pillars can also be tapered with the top being wider than the bottom. Tapered or t-shaped pillars are described in, for example, Ext. Abstr. 44$^{th}$ Spring Meeting Japan Society of applied Physics and related Societies, 1997, and U.S. Pat. Nos. 5,962,970, 5,952,037, 5,742,129, or 5,701,055, which are all herein incorporated by reference for all purposes. The pillars are formed on the substrate after the formation of the lower conductive layer 106. Thereafter, the organic layer and conductive layer are deposited. Due to the profile of the pillars, the continuity of the upper conductive layer is disrupted, leaving segments of the conductive layer 108a over the organic layer 104 and segments 108b on top of the pillars.

However, the functional stack is susceptible to damage resulting from exposure to atmospheric constituents like oxygen and moisture that penetrated into the interior of the device. The cathode layer comprises, for example, magnesium (Mg), calcium (Ca), barium (Ba), silver (Ag), aluminium (Al) or a mixture or alloy thereof, which are susceptible to damage caused by exposure to any potentially deleterious substance such as water vapor and oxygen.

Referring to FIG. 1, the edges of the functional stack layers are exposed due to the profile of the pillars 114. Open edges such as 120 of the upper conductive layer and organic layer are especially susceptible to damage caused by water and oxygen and are typically areas which are affected first. The result may be shrinking pixels or dark, non-emitting spots due to the lack of current flow, leading to a reduction in the useful life of the OLED device.

Known methods typically employed to protect the functional stack include hermetically sealing the device and providing a desiccant inside the device to absorb oxygen and moisture that permeates through the sealant. However, residual oxygen and moisture still remaining within the encapsulated device will cause the shrinkage of pixels over time, due to the reaction with oxygen and water, typically starting at the exposed edges of the functional layers.

Alternatively, the upper conductive layer comprises an electron-emitting cathode layer and a protective conductive layer. The electron-emitting layer comprises, for example, Ca, Mg and/or Ba, or a mixture or alloy thereof, which are highly reactive to air and water. The protective layer comprises, for example, more stable materials such as silver (Ag), platinum (Pt), chromium (Cr), gold (Au) and/or aluminum (Al) or a mixture or alloy thereof. The protective conductive layer covers a surface of the electron-emitting layer to protect it from exposure, but does not cover the edges of the cathode layer due to the profile of the pillars. Hence, the edges of the cathode layer are still exposed to residual oxygen and water.

As evidenced from the foregoing discussion, it is desirable to provide a method to effectively pattern electrodes in the fabrication of OLED devices and protect the edges of the functional stack from damage caused by exposure to potentially deleterious substances.

SUMMARY OF THE INVENTION

The invention relates generally to the fabrication of devices such as OLED devices. In one embodiment of the invention, pillars are provided to pattern a conductive layer. The profile of the pillar serves to cover the edges of organic and conductive layers. In one embodiment, a pillar comprises a cap formed on a base, the base having a width at the top or upper portion that is narrower than a width at the bottom or lower portion.

PREFERRED EMBODIMENTS OF THE INVENTION

Figure 2:
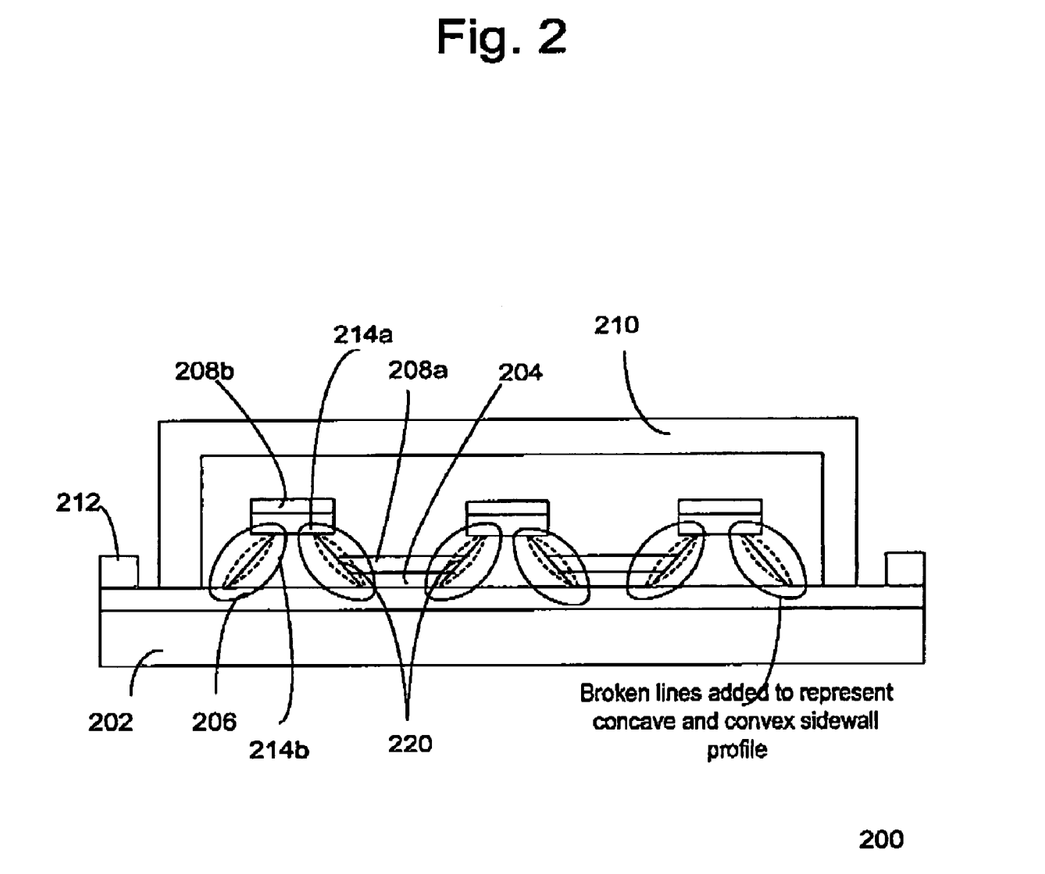
FIG. 2 shows one embodiment of the invention.

FIG. 2 shows an OLED device 200 in accordance with one embodiment of the invention. The device comprises a substrate 202 on which OLED cells are formed. In one embodiment, the substrate comprises a transparent substrate, such as glass for viewing the cells through the substrate. Other types of transparent materials that can serve as a substrate to support the OLED pixels are also useful. Non-transparent substrates can also be used with, for example, applications in which the cells are visible through a cap 210.

The OLED cells comprise a functional stack formed by one or more organic functional layers 204 formed between first and second conductive functional layers 206 and 208, the first and second functional conductive layers serving as first and second electrodes. In one embodiment, the first electrodes 206 are anodes and the second electrodes 208a are cathodes. Forming the first electrodes that are cathodes and second electrodes that are anodes is also useful. The first and second electrodes, for example, are formed as strips in respective first and second directions to create an array of OLED cells. Typically, the first and second directions are orthogonal to each other. Bond pads 212 are electrically coupled to the cathodes and anodes. The cap 210 is provided to encapsulate the OLED cells.

Figure 8:
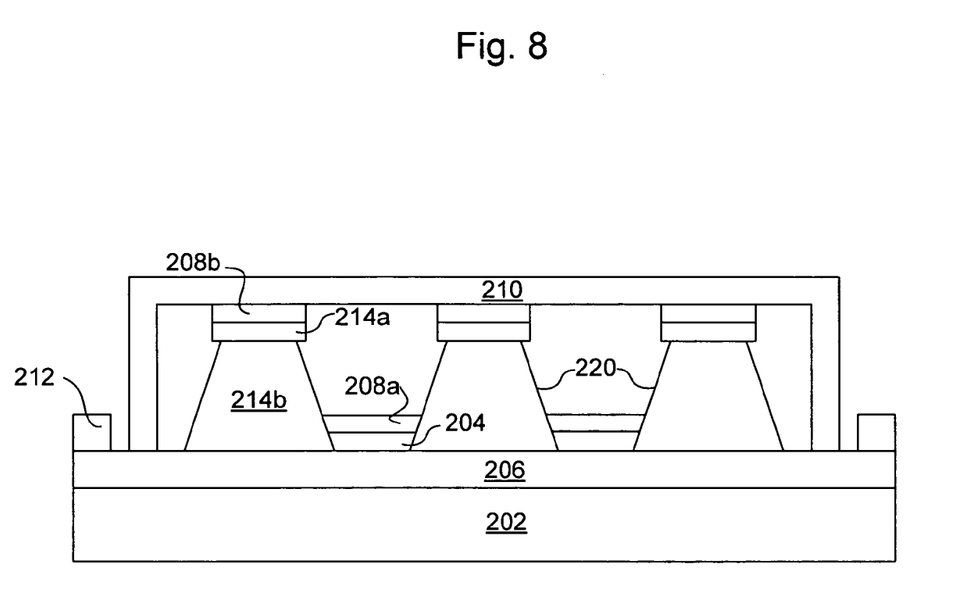
FIG. 8 shows one embodiment of the invention.

Pillars 214 which extend above the OLED cells are provided on the substrate surface to facilitate the patterning of the second conductive layer. The pillars can also extend the height of the cavity to support the cap (as shown in FIG. 8). This is particularly useful for flexible OLED devices since the cap is prevented from contacting and damaging the cells. The pillars are used to pattern the conductive layer as desired to create separate OLED cells. For example, the pillars create rows of second electrodes 208a to form an array of OLED cells. Pillars which create other patterns for the second electrodes are also useful. OLED cells are located between the pillars where the second electrodes overlap the first electrodes. The gap between the pillars defines the pixel size, which is for example, about 20–500 μm.

In accordance with the invention, the profile of the pillar is selected to have the edges 220 of the functional layer or layers (204 or 208) covered. By covering the edges of the functional layers, the edges are protected from exposure to potentially deleterious substances like water and oxygen, which can adversely impact the reliability and lifetime of the OLED device. The height of the pillar is, for example, about 1–10 μm, and preferably about 2–5 μm. The width of the pillar should preferably be as small as possible to provide a large emissive area.

In one embodiment, a pillar comprises a pillar cap 214a formed on a pillar base 214b. The pillar cap overhangs the base of the pillar. The width of the pillar cap should be sufficient to disrupt the continuity of the second conductive layer 208 during deposition. In one embodiment, the width of the pillar cap is about 10–100 μm. The profile of the pillar base is selected to have the edges of the functional layer or layers (204 or 208) covered by the base sidewalls. Preferably, the profile of the base is selected to maximize the surface area of the organic and conductive functional layers while protecting their edges. The pillar base comprises an upper and lower portion. A width at the top or upper portion of the pillar base is narrower than a width at the bottom or lower portion. The width of the upper portion of the pillar base should be sufficient to ensure mechanical stability, and the width of the lower portion of the pillar base should be wide enough to provide the desired protection. The width of the upper portion is, for example, about 5–50 μm, and the width of the lower portion is, for example, about 10–100 μm wider than the upper width. In a preferred embodiment, the pillar base comprises a tapered or inverted v-shaped profile formed from, for example, a single device layer. In one embodiment, the sidewalls of the pillar base is about 45–65° (from the vertical). Other angles can also be useful. The sidewalls may be flat, convex or concave.

Preferably, the pillars comprise a material which is stable during the fabrication process. In one embodiment, the pillars are formed by patterning a photosensitive material such as resist. Other methods of forming the pillars, such as etching, are also useful. The resist, when necessary, is treated to render it inert to solvents used to deposit the functional organic layers. Other types of photosensitive materials, such as photosensitive polyamide or photosensitive polybenzoxazole, are also useful. In addition, electron cure resist systems, such as those manufactured by Allied Signal, can also be used to form pillars having the desired cross-sectional shape. Non-photosensitive insulating materials such as resins can also be used to form the pillars.

Figure 3:
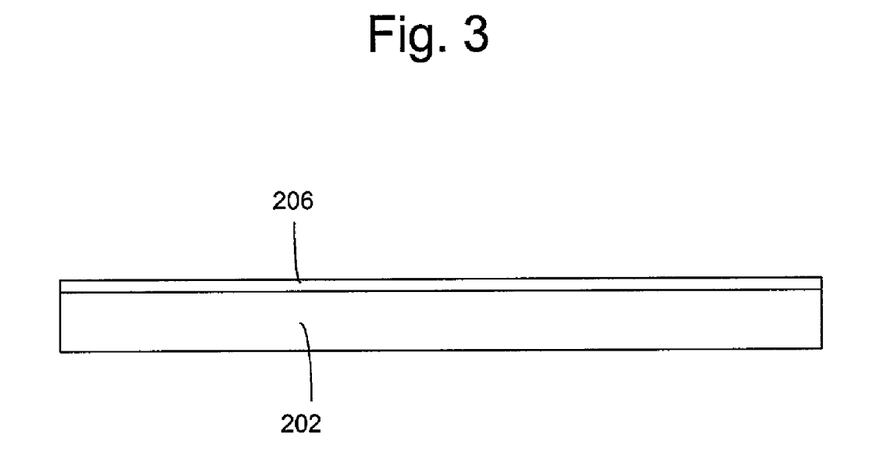
FIGS. 3–7 show a process for fabricating an OLED device in accordance with one embodiment of the invention.

FIGS. 3–6 show a process for fabricating an OLED device according to one embodiment of the invention. Referring to FIG. 3, a substrate 202 is provided. In one embodiment, the substrate comprises a transparent material, for example, soda lime or borosilicate glass. Other types of materials can also be used to serve as the substrate. The substrate typically is about 0.2–1.1 mm thick.

In another embodiment, the substrate comprises a thin flexible substrate. Thin flexible substrates are formed from, for example, plastic films such as transparent poly(ethylene terephthalate) (PET), poly(butylene terephthalate) (PBT), poly(enthylene naphthalate) (PEN), polycarbonate (PC), polyimides (PI), polysulfones (PSO), and poly(p-phenylene ether sulfone) (PES). Other materials such as polyethylene (PE), polypropylene (PP), poly(vinyl chloride) (PVC), polystyrene (PS) and poly(methyl methyleacrylate) (PMMA), can also be used to form the substrate. Alternatively, materials such as ultra thin glass (e.g., thickness between 10–200 μm), a composite stack comprising glass and polymer or polymer films coated with inorganic barrier layers can also be used.

The substrate includes first conductive layer 206 formed on the surface thereof. The first conductive layer serves as, for example, anodes. The anodes are formed from a conductive material. In one embodiment, the conductive material comprises a transparent conductive material such as indium-tin-oxide (ITO). Other transparent conductive materials, for example, indium-zinc-oxide, zinc-oxide, tin-oxide, are also useful. In one embodiment, the anodes are arranged in strips in a first direction, each being separated by a space. Preferably, the space separating the anodes is less than 50 μm wide. Connections to bond pads can also be provided. Various techniques, such as photolithography, can be used to form the anodes.

Figure 4:
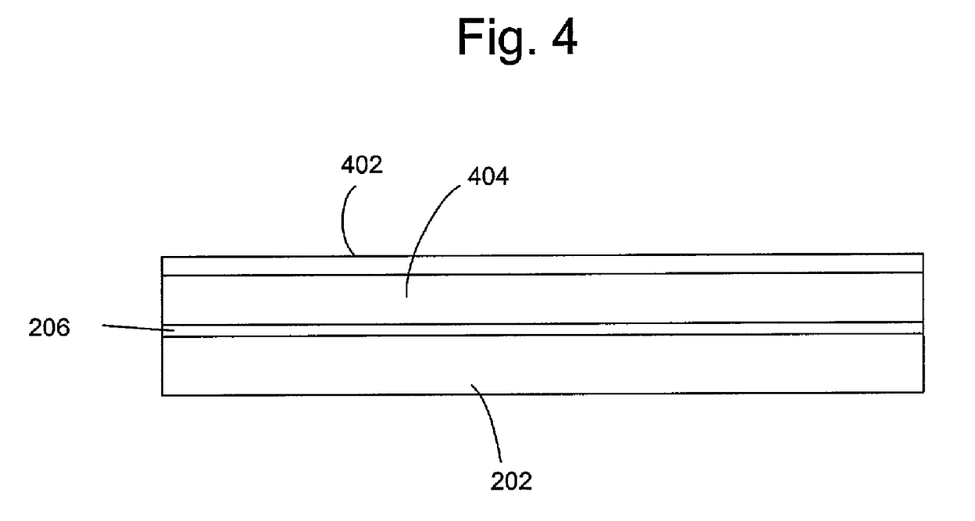

Referring to FIG. 4, at least 2 device layers 402 and 404 are deposited on the substrate. The device layers are used to create the pillars which facilitate the patterning of a second conductive layer to form the second electrodes (e.g., cathodes). The combined thickness of the device layers is equal to the height of the pillars. The thickness of the upper device layer 402 is, for example, about 1–100 μm. The thickness of the lower device layer 404 is, for example, about 1–20 μm.

The materials for the device layers preferably have different characteristics to produce the desired structure. In one embodiment, the device layers comprise photosensitive layers that are negative acting and/or positive acting, or a combination thereof. In another embodiment, the device layers comprise photosensitive layers that are sensitive to different exposure wavelengths, wherein the upper layer is transparent to the underlying layer's exposure wavelength. The upper device layer comprises, for example, a negative acting photosensitive layer such as photoresist AZ n LOF 2000, and the lower device layer comprises a positive acting photosensitive layer such as photoresist AZ Mir 703 manufactured by Clariant. Other types of photosensitive materials can also be used.

The device layers are deposited on the substrate one after the other by, for example, spin-coating. In one embodiment, the resist is deposited by spinning the substrate at 1000 rpm for about 20 seconds using a Karl Suess RC 8 spin-coater. After depositing the resist, the substrate is baked at, for example, 90° C. for about 2 minutes to remove the resist solvent.

Figure 5:
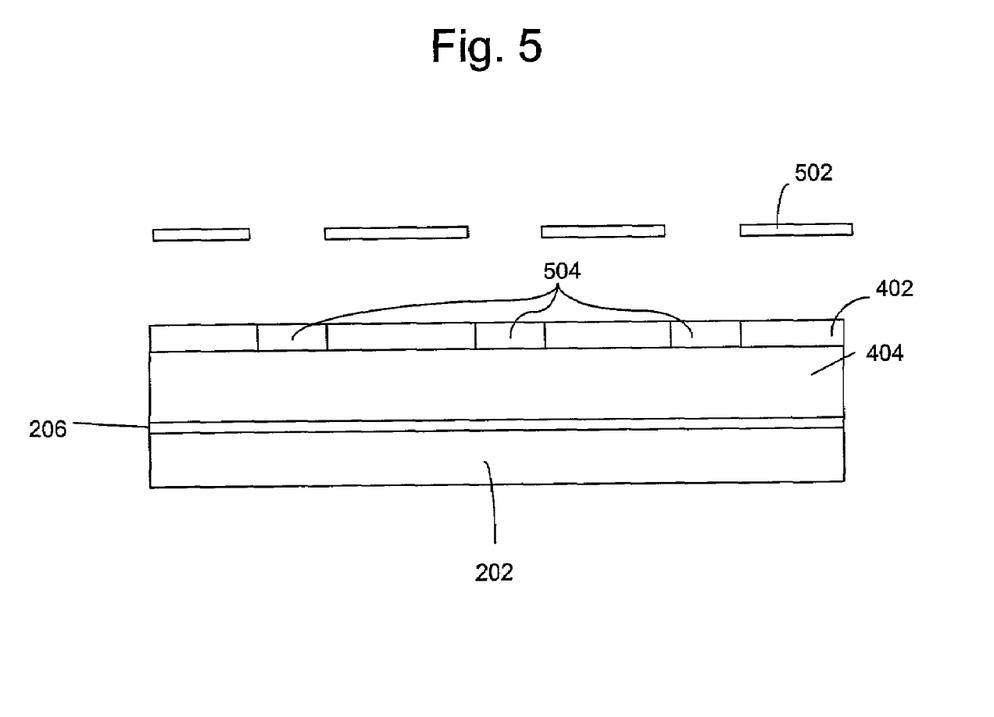

In FIG. 5, the upper device layer 402 is selectively exposed to light from an exposure source through, for example, a mask 502. The exposure process is designed to form overhanging caps 504 for patterning the conductive layer. The exposure process comprises, for example, exposing the photosensitive layer with ultra-violet (UV) radiation during development.

The upper device layer is then prepared for development to remove the unexposed portions for a negative acting resist. The preparation includes a post-exposure bake to cross-link the resist in the exposed regions. The post-exposure bake is performed at, for example, about 120° C. for about 60–90 seconds. Cross-linking renders the resist insoluble to the resist development chemistry.

Figure 6:
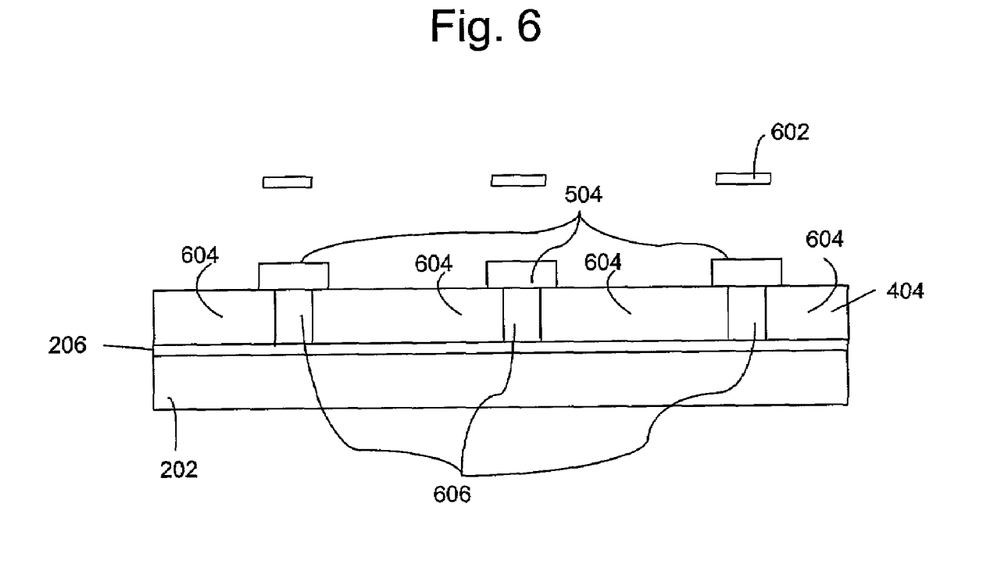

Referring to FIG. 6, the lower device layer 404 is selectively exposed to light from an exposure source through a mask 602. The exposure process is engineered to form pillar bases with the desired profile. The exposure process comprises, for example, successively exposing the photosensitive layer with electrons or charged particles having different energies with different penetration depths to form the profile during development. For a positive acting photosensitive layer, the upper portion is exposed with a greater amount of energy than the lower portion. Alternatively, high optical absorption can be used in combination with optical exposure in pre-dyed resist systems.

In one embodiment, a positive resist layer is selectively exposed with an exposure source through a mask 602. The exposure results in the upper portions of regions 604 absorbing a greater amount of light than the lower portions (i.e., overexposing the upper portions of regions 604). Regions 606 correspond to locations where pillar bases are to be formed. In one embodiment, the resist is exposed with I line radiation.

Figure 7:
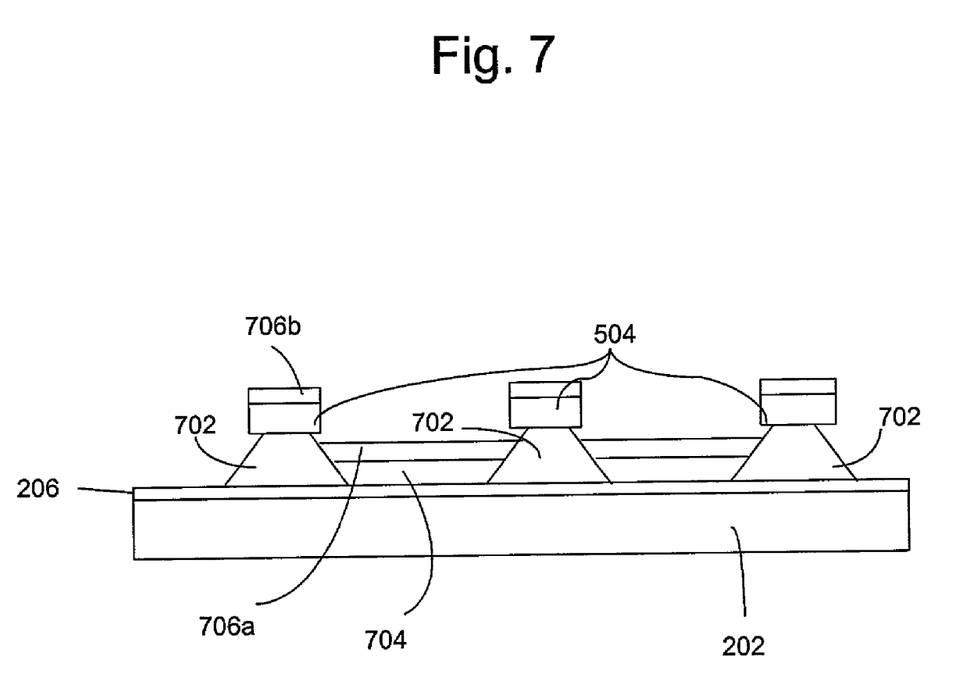

Referring to FIG. 7, the lower device layer is developed with a resist development chemistry to remove the exposed regions, leaving pillar bases 702. The resist chemistry, for example, comprises an alkaline developer such as AZ 726 manufactured by Clariant. The resist is developed in the development chemistry at room temperature for about 60 seconds. Because the upper portion of the exposed regions were overexposed, they are more soluble to the resist chemistry. This creates pillar bases 702 having a profile that is narrower at upper portion than at the lower portion. The resist is then rinsed with de-ionized water to remove the developer.

After forming the pillars, the resist is cured to improve the mechanical stability of the pillars and to render pillars inert to the organic solvents used to form the functional organic layers. In one embodiment, the resist is cured by heat. Other curing techniques such as electron beam (e-beam), particle (proton, alpha) or UV curing can also be used. After curing, the substrate is cleared by subjecting it to UV-$O_3$ for about 3 minutes, removing small organic residues on the exposed portions of the substrate.

Referring to FIG. 7, one or more functional organic layers 704 are deposited on the substrate. In one embodiment, two functional organic layers are deposited. For example, the first organic layer comprises a conductive polymer such as Polyaniline (PANI) or Polyethylenedioxythiophene (PEDOT) (Baytron P from Bayer AG, Germany). The conductive polymer is dissolved in water or other polar solvents and deposited by spin-coating or other wet deposition techniques followed by a baking step for solvent removal. The second organic layer comprises a conjugated polymer. The polymer is dissolved in a solvent and deposited by spin-coating techniques. In one embodiment, the organic layer comprises a 1% solution of electro-luminescent polymer dissolved in xylene deposited by spinning the substrate at 4000 rpm for about 30 seconds. Other wet deposition techniques are also useful. Such techniques, for example, include printing techniques (e.g., screen printing, off-set printing, ink-jet printing) in which the organic functional layer is dissolved in a solvent (e.g., NMP, or hexene). Depositing the organic functional layers by a wet process is advantageous, as it is substantially self-planarizing, resulting in the layer filling the area between the pillars with a substantially planar surface. The pillars, due to curing, are not adversely affected by the solvents. Additional functional layers can be deposited to form a functional organic stack. The thickness of the organic layer or stack is typically about 2–200 nm. After depositing the functional organic layer, the substrate is heated to a temperature of about 85° C. for about 1 minute to evaporate the solvent.

A second conductive layer 706 is deposited on the substrate. The second conductive layer comprises any suitable materials, such as Ca, Mg, Ba, Ag, Al or a mixture or alloy thereof. Other conductive materials, particularly those comprising a low work function, can also be used to form the second conductive layer. In one embodiment, the second conductive layer comprises Ca. The Ca is deposited by thermal evaporation at a rate of 1 nm/s and a pressure of about $10^{-5}$ mbar. Other deposition techniques, such as sputtering (PVD), chemical vapor deposition (CVD), plasma enhanced chemical vapor deposition (PECVD) or metal organic chemical vapor deposition (MOCVD), are also useful. The continuity of the second conductive layer is disrupted by the pillars, patterning it to form cathodes 706a to create an array of OLED pixels. The process continues to complete the OLED device. For example, a cap is mounted on the substrate to encapsulate the device and bond pads are formed to provide electrical access to the OLED pixels.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A device comprising:
   a substrate having a plurality of OLED cells, the OLED cells comprising at least one organic layer formed between first and second conductive layers, wherein the first conductive layer is adjacent to the substrate; and
   pillars on the substrate for patterning the second conductive layer, wherein at least one of the pillars includes first and second photosensitive layers with the first photosensitive layer disposed below and in contact with the second photosensitive layer, the first photosensitive layer forms a base of the pillar and the second photosensitive layer forms a cap of the pillar such that the cap overhangs the base, the base has a profile with a substantially sloped section and a lower portion of the base is wider than an upper portion;
   wherein side edges of the organic layer and side edges of the second conductive layer are in contact with only the sloped section of the base; and
   wherein the first photosensitive layer has a different composition from the second photosensitive layer.

2. The device of claim 1 wherein the first photosensitive layer comprises a positive photosensitive material.

3. The device of claim 2 wherein the base is formed by exposing the positive photosensitive material of the first photosensitive layer such that the upper portion is exposed with more energy than the lower portion.

4. The device of claim 2 wherein the second photosensitive layer comprises a negative photosensitive material.

5. The device of claim 2 wherein the base is formed by exposing the positive photosensitive material of the first photosensitive layer such that the upper portion is exposed with more energy than the lower portion.

6. The device of claim 1 wherein the second photosensitive layer comprises a negative photosensitive material.

7. The device of claim 6 wherein the first photosensitive layer comprises a positive photosensitive material and the base is formed by exposing the positive photosensitive material of the first layer such that the upper portion is exposed with more energy than the lower portion.

8. The device of claim 1 wherein the first photosensitive layer comprises a positive photosensitive material and the base is formed by exposing the positive photosensitive material of the first layer such that the upper portion is exposed with more energy than the lower portion.

9. The device of claim 1 wherein the profile of the base comprises a flat, concave or convex shape.

10. The device of claim 9 wherein the first and second photosensitive layers are cured to render them inert to a wet deposition process for forming the at least one organic layer.

11. The device of claim 9 wherein the at least one organic layer comprises a conjugated polymer.

12. The device of claim 1 wherein the first and second photosensitive layers are cured to render the first and second layers inert to a wet deposition process for forming the at least one organic layer.

13. The device of claim 1 wherein the at least one organic layer comprises conjugated polymer.

14. The device of claim 1 wherein the sidewall profile of the base makes an angle with the vertical of about 45° to about 65°.

15. The device of claim 1, wherein the base is configured and the first photosensitive layer is selected so that contact between the substantially smooth tapered sidewall and the side edges of the organic layer and the side edges of the second conductive layer protects the side edges of the organic layer and the side edges of the first region of the second conductive layer from oxygen and water.

16. The device of claim 1, wherein the pillars are on top of the first conductive layer.

17. The device of claim 1, wherein the first photosensitive layer has a different sensitivity to light than the second photosensitive layer.

18. The device of claim 1, wherein the lower portion of the base is wider than the cap of the pillar.

19. The device of claim 1, wherein:
a device cap is provided to encapsulate the OLED cells, creating a cavity between the OLED cells and the device cap; and
the pillars extend the height of the cavity to support the device cap.

20. The device of claim 1, wherein the cap of the pillar extends in a direction parallel with a main surface of the substrate beyond an edge of at least part of the base, wherein the edge is not parallel to the main surface of the substrate.

21. The device of claim 1, wherein the organic layer is in contact with the first conductive layer.

22. The device of claim 1, wherein the first region of the second conductive layer is in contact with the organic layer.

23. A device comprising:
a substrate having a plurality of OLED cells, the OLED cells comprising at least one organic layer formed between a first conductive layer and a second conductive layer, wherein the first conductive layer is adjacent to the substrate; and
pillars on the substrate for patterning the second conductive layer to establish a first region and a second region of the second conductive layer,
wherein at least one of the pillars includes first and second photosensitive layers with the first photosensitive layer disposed below and in contact with the second photosensitive layer, the first photosensitive layer forms a base of the pillar and the second photosensitive layer forms a cap of the pillar, the cap overhangs the base, the base has a profile with a substantially smooth tapered sidewall and a lower portion of the base is wider than an upper portion, side edges of the organic layer and side edges of the first region of the second conductive layer are in contact with the substantially smooth tapered sidewall of the base, the first photosensitive layer includes a positive photosensitive material and the second photosensitive layer includes a negative photosensitive material, and
wherein the second region of the second conductive layer is in contact with the second photosensitive layer.

24. The device of claim 23, wherein the lower portion of the base is wider than the cap of the pillar.

25. An OLED device comprising:
a substrate having a plurality of OLED cells, the OLED cells comprising at least one organic layer formed between a first conductive layer and a second conductive layer, wherein the first conductive layer is adjacent to the substrate; and
pillars on the substrate for patterning the second conductive layer to establish a first region and a second region of the second conductive layer,
wherein at least one of the pillars includes first and second layers with the first layer disposed below and in contact with the second layer, the first layer includes a first material that is photosensitive and forms a base of the pillar and the second layer is a different material than the first layer and forms a cap of the pillar, the cap overhangs the base, the base has a profile with a substantially smooth tapered sidewall and a lower portion of the base is wider than an upper portion, side edges of the organic layer and side edges of the first region of the second conductive layer are in contact with the substantially smooth tapered sidewall of the base, and
wherein the second region of the second conductive layer is in contact with the second layer.

26. The device of claim 25, wherein the lower portion of the base is wider than the cap of the pillar.

27. A device comprising:
a substrate having a plurality of OLED cells, the OLED cells comprising at least one organic layer formed between a first conductive layer and a second conductive layer; and
pillars on the substrate for patterning the second conductive layer to establish a first region and a second region of the second conductive layer,
wherein at least one of the pillars includes first and second photosensitive layers with the first photosensitive layer in contact with the second photosensitive layer, the first photosensitive layer forms a base of the pillar and the second photosensitive layer forms a cap of the pillar such that the cap overhangs the base, the cap extending in a direction parallel with a main surface of the substrate and beyond at least part of a sidewall of the base, wherein the sidewall is not parallel to the main surface of the substrate and a lower portion of the base is wider than an upper portion and the lower portion of the base is wider than the cap of the pillar;

wherein side edges of the organic layer and side edges of the first region of the second conductive layer are in contact with the base;

the first photosensitive layer has a different property from the second photosensitive layer; and the second region of the second conductive layer is in contact with the second photosensitive layer.

28. The device of claim 27, wherein the first photosensitive layer has a different sensitivity to light than the second photosensitive layer.

29. The device of claim 27, wherein the first photosensitive layer has a different composition from the second photosensitive layer.

30. The device of claim 27, wherein:

a device cap is provided to encapsulate the OLED cells, creating a cavity between the OLED cells and the device cap; and the pillars extend the height of the cavity to support the device cap.

31. A device comprising:

a substrate having a plurality of OLED cells, the OLED cells comprising at least one organic layer formed between a first conductive layer and a second conductive layer; and pillars on the substrate for patterning the second conductive layer to establish a first region and a second region of the second conductive layer, wherein at least one of the pillars consists of first and second photosensitive layers, the first photosensitive layer forms a base of the pillar and the second photosensitive layer forms a cap of the pillar such that the cap overhangs the base, the cap extending in a direction parallel with a main surface of the substrate and beyond at least part of a sidewall of the base, wherein the sidewall is not parallel to the main surface of the substrate and a lower portion of the base is wider than an upper portion and the lower portion of the base is wider than the cap of the pillar;

wherein side edges of the organic layer and side edges of the first region of the second conductive layer are in contact with the base, the first photosensitive layer has a different property from the second photosensitive layer, and the second region of the second conductive layer is in contact with the second photosensitive layer.

32. A device comprising:

a substrate having a plurality of OLED cells, the OLED cells comprising at least one organic layer formed between a first conductive layer and a second conductive layer, wherein the first conductive layer is adjacent to the substrate; and pillars on the substrate for patterning the second conductive layer to establish a first region and a second region of the second conductive layer, wherein at least one of the pillars includes first and second photosensitive layers with the first photosensitive layer disposed below and in contact with the second photosensitive layer, the first photosensitive layer forms a base of the pillar and the second photosensitive layer forms a cap of the pillar such that the cap overhangs the base, the base has a profile with a substantially smooth tapered sidewall and a lower portion of the base is wider than an upper portion;

wherein side edges of the organic layer and side edges of the second conductive layer are in contact with the substantially smooth tapered sidewall of the base, the first photosensitive layer has a different composition from the second photosensitive and there is a defined boundary between the first and second photosensitive layers, and the second region of the second conductive layer is in contact with the second photosensitive layer.

* * * * *